United States Patent
Endo et al.

(10) Patent No.: US 9,023,487 B2
(45) Date of Patent: May 5, 2015

(54) LAMINATED STRUCTURE AND METHOD FOR PRODUCING THE SAME

(75) Inventors: Yousuke Endo, Kitaibaraki (JP); Masaru Sakamoto, Kitaibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 13/808,009

(22) PCT Filed: Jul. 25, 2012

(86) PCT No.: PCT/JP2012/068838
§ 371 (c)(1),
(2), (4) Date: Jan. 2, 2013

(87) PCT Pub. No.: WO2013/042451
PCT Pub. Date: Mar. 28, 2013

(65) Prior Publication Data
US 2013/0143069 A1    Jun. 6, 2013

(30) Foreign Application Priority Data

Sep. 21, 2011   (JP) ................. 2011-206363

(51) Int. Cl.
| | |
|---|---|
| B32B 15/00 | (2006.01) |
| B23K 35/00 | (2006.01) |
| B23K 1/00 | (2006.01) |
| B23K 35/26 | (2006.01) |
| C23C 14/34 | (2006.01) |
| B23K 1/19 | (2006.01) |

(52) U.S. Cl.
CPC ........... *B23K 1/00* (2013.01); *Y10T 428/12681* (2013.01); *B23K 35/26* (2013.01); *B23K 35/262* (2013.01); *C23C 14/3414* (2013.01); *B23K 1/19* (2013.01)

(58) Field of Classification Search
CPC ............................. B32B 15/00; B23K 35/262
USPC ................................. 428/642, 646
See application file for complete search history.

(56) References Cited

U.S. PATENT DOCUMENTS

| | | | |
|---|---|---|---|
| 3,046,651 A * | 7/1962 | Olmon et al. ................. 438/537 |
| 5,054,195 A | 10/1991 | Keck et al. | |
| 5,269,453 A * | 12/1993 | Melton et al. ............ 228/180.22 |
| 5,630,918 A | 5/1997 | Takahara et al. | |
| 6,719,034 B2 | 4/2004 | Heck et al. | |
| 2003/0089482 A1 | 5/2003 | Heck et al. | |
| 2005/0029675 A1* | 2/2005 | Hua .............................. 257/779 |
| 2005/0269385 A1* | 12/2005 | Chen et al. ................. 228/180.22 |
| 2008/0271779 A1 | 11/2008 | Miller et al. | |
| 2009/0065354 A1 | 3/2009 | Kardokus et al. | |
| 2009/0250337 A1 | 10/2009 | Simons et al. | |
| 2009/0277777 A1* | 11/2009 | Schultheis et al. ......... 204/192.1 |
| 2010/0099214 A1 | 4/2010 | Buquing | |
| 2010/0165585 A1* | 7/2010 | Lin et al. ....................... 361/748 |
| 2011/0067997 A1 | 3/2011 | Nguyen et al. | |
| 2011/0089030 A1 | 4/2011 | Juliano et al. | |
| 2012/0213917 A1 | 8/2012 | Simons et al. | |
| 2012/0273348 A1 | 11/2012 | Endo et al. | |
| 2013/0037408 A1 | 2/2013 | Endo et al. | |
| 2013/0105311 A1 | 5/2013 | Maekawa et al. | |
| 2013/0153414 A1 | 6/2013 | Endo et al. | |
| 2013/0270108 A1 | 10/2013 | Endo et al. | |

FOREIGN PATENT DOCUMENTS

| | | |
|---|---|---|
| CN | 102644053 A | 8/2012 |
| DE | 10063383 C1 | 3/2002 |
| EP | 2287356 A1 | 2/2011 |
| JP | 57-185973 A | 11/1982 |
| JP | 58-145310 A | 8/1983 |
| JP | 63-111172 A | 5/1988 |
| JP | 63-044820 B | 9/1988 |
| JP | 3-99741 A | 4/1991 |
| JP | 4-301074 A | 10/1992 |
| JP | 5-214519 A | 8/1993 |
| JP | 6-287661 A | 10/1994 |
| JP | 8-60352 A | 3/1996 |
| JP | 8-218165 A | 8/1996 |
| JP | 8-281208 A | 10/1996 |
| JP | 9-25564 A | 1/1997 |
| JP | 10-280137 A | 10/1998 |
| JP | 11-236664 A | 8/1999 |
| JP | 2003-89869 A | 3/2003 |
| JP | 2003-136190 A | 5/2003 |
| JP | 2003-183820 A | 7/2003 |
| JP | 2003-533589 A | 11/2003 |
| JP | 2004-131747 A | 4/2004 |
| JP | 2005-2364 A | 1/2005 |
| JP | 2006-102807 A | 4/2006 |
| JP | 2006-322039 A | 11/2006 |
| JP | 2008-523251 A | 7/2008 |
| JP | 2009-242882 A | 10/2009 |
| JP | 2010-024474 A | 2/2010 |
| JP | 2011-236445 A | 11/2011 |
| JP | 4837785 B1 | 12/2011 |
| JP | 2012-172265 A | 9/2012 |
| TW | I310409 B | 6/2009 |
| WO | 01/73156 A2 | 10/2001 |
| WO | 2012/029364 A1 | 3/2012 |
| WO | 2014/030362 A1 | 2/2014 |

OTHER PUBLICATIONS

International Search Report mailed Aug. 28, 2012 in corresponding PCT application No. PCT/JP2012/068838.

(Continued)

*Primary Examiner* — Humera Sheikh
*Assistant Examiner* — Lucas Wang
(74) *Attorney, Agent, or Firm* — Nields, Lemack & Frame, LLC

(57) ABSTRACT

Provided by the present invention is a laminated structure with good use efficiency, in which diffusion of tin from an indium-tin solder material to an indium target is favorably suppressed, and a method for producing the same. The laminated structure has a backing plate, an indium-tin solder material, and an indium target laminated in this order, and the concentration of tin in the 2.5 to 3.0 mm thickness range of the indium target from the indium-tin solder material side surface is 5 wtppm or less.

5 Claims, No Drawings

(56) References Cited

OTHER PUBLICATIONS

International Preliminary Report on Patentability mailed Feb. 28, 2013 in PCT application No. PCT/JP2011/060969.
International Search Report mailed Aug. 9, 2011 in co-pending PCT application No. PCT/JP2011/065585.
International Search Report mailed Aug. 9, 2011 in co-pending PCT application No. PCT/JP2011/065587.
Taiwanese Communication, with English translation, dated Aug. 27, 2012 in co-pending Taiwanese patent application No. 100127178 (Taiwan).
International Search Report mailed Jun. 28, 2011 in co-pending PCT application No. PCT/JP2011/061682.
International Search Report mailed Jun. 7, 2011 in co-pending PCT application No. PCT/JP2011/060969.
International Preliminary Report on Patentability mailed Mar. 14, 2013 in co-pending PCT application No. PCT/JP2011/061682.
English translation of International Search Report mailed Aug. 28, 2012 in corresponding PCT application No. PCT/JP2012/068838.
International Search Report/Written Opinion dated Sep. 11, 2012 in co-pending PCT application No. PCT/JP2012/070766.
Alloy Digest, Indium Semi-Conductor Grade (data sheet), ASM International, Mar. 1998, 2 pages.
Office Action mailed Dec. 18, 2013 in co-pending U.S. Appl. No. 13/504,338.
International Preliminary Report in Patentability mailed Oct. 31, 2013 in co-pending PCT application No. PCT/JP2011/065587.
Office Action mailed Oct. 18, 2013 in co-pending U.S. Appl. No. 13/504,329.
English translation of the Written Opinion mailed Aug. 9, 2011 in co-pending PCT application No. PCT/JP2011/065585.
English translation of the International Preliminary Report on Patentability transmitted Sep. 12, 2013 in co-pending PCT application No. PCT/JP2011/065585.
English translation of the International Search Report mailed Sep. 11, 2012 in co-pending PCT application No. PCT/JP2012/070766.
English translation of the Written Opinion transmitted Jun. 7, 2013 in co-pending PCT application No. PCT/JP2012/070766.
Office Action—Restriction—mailed Sep. 27, 2013 in co-pending U.S. Appl. No. 13/504,338.
Final Rejection mailed Apr. 9, 2014 in co-pending U.S. Appl. No. 13/504,329.
Final Rejection mailed Jun. 16, 2014 in co-pending U.S. Appl. No. 13/504,338.
English translation of International Preliminary Report on Patentability issued Mar. 25, 2014 in corresponding PCT application No. PCT/JP2012/068838.
Glossary of Metallurgical and Metalworking Terms, Metals Handbook, ASM Handbooks Online, ASM International, 2002, pp. 130-131, 4 pages.
A Dictionary of Chemistry, Sixth Edition, 2008, p. 283, p. 434, John Daintith, ed., 4 pages.
European communication mailed Jan. 2, 2014 in co-pending European patent application No. 11821381.8.
Office Action mailed Dec. 31, 2014 in co-pending U.S. Appl. No. 13/704,086.
Final Rejection mailed Sep. 26, 2014 in co-pending U.S. Appl. No. 13/504,329.
Final Rejection mailed Sep. 22, 2014 in co-pending U.S. Appl. No. 13/504,338.
Office Action mailed Sep. 26, 2014 in co-pending U.S. Appl. No. 13/809,296.
International Preliminary Report on Patentability mailed Jul. 17, 2014 in co-pending PCT application No. PCT/JP2012/070766.
International Search Report mailed May 7, 2013 in co-pending PCT application No. PCT/JP2013/052263.
Final Rejection mailed Jan. 28, 2015 in co-pending U.S. Appl. No. 13/809,296.

* cited by examiner

LAMINATED STRUCTURE AND METHOD FOR PRODUCING THE SAME

BACKGROUND OF THE INVENTION

1. Field of the Invention

The present invention relates to a laminated structure and a method for producing the same. More specifically, the present invention relates to a laminated structure having a backing plate and an indium target and a method for producing the same.

2. Description of the Related Art

In general, as disclosed in Japanese Patent Application Laid-Open No. 10-280137, a sputtering target is often used as a solder material in a state in which it is bonded to a backing plate having indium.
(Patent Document 1)
Japanese Patent Application Laid-Open No. 10-280137

SUMMARY OF THE INVENTION

In case of an indium target, when an indium solder material is used for bonding, since both the target and solder material are composed of indium, a problem arises in that melting of the target itself can be caused. For such reasons, a casting method of placing a mold on a backing plate and performing direct casting or a bonding method using special adhesives has been conventionally used for an indium target. However, adhesion ratio may not be sufficient when special adhesives are used, and thus defects are sometimes introduced during sputtering. Thus, for bonding with indium target, there is also a case in which indium-tin alloy having lower melting point than indium is used as a solder material for bonding.

However, the difference in melting point between an indium target and an indium-tin solder material is approximately 35° C., and the melting point decrease caused by diffusion and solid solution of tin continuously occurs on a bonding surface. For such reasons, the diffusion of tin from an indium target side is greatly accelerated, and it leads to a problem that, in the indium target, the tin is diffused to 4 mm thickness range from the backing plate side surface. Specifically, although the diffusion of tin near 3 to 4 mm region in the thickness direction from the surface of the backing plate side is lowered to several tens of wtppm, it may be 100 wtppm or more near the 2 to 3 mm region in the thickness direction, for example. Since the target thickness is generally from 5 to 20 mm, 15 to 60% region of the target itself is contaminated by tin and the contaminated tin is diffused for such case. An indium film obtained by sputtering an indium target is used for a CIGS (Cu—In—Ga—Se) type solar cell, and thus it is required for an indium target to have high purity of 4 N or more. To maintain such high purity for the indium target in which tin contaminates and then the contaminated tin is diffused, sputtering cannot be made for the region contaminated by tin diffusion, and thus a significant reduction in use efficiency is caused.

Under the circumstances, an object of the invention is to provide a laminated structure with good use efficiency in which diffusion of tin from an indium-tin solder material to an indium target is favorably suppressed, and a method for producing the same.

Diffusion rate of tin has temperature dependency. Inventors of the present invention have confirmed that, when an indium target and a backing plate are fully heated at the temperature which is equal to or higher than the melting point of a solder material and also equal to or lower than the melting point of indium and are bonded with a solder material, tin diffusion progresses into a 4 mm region in the thickness direction from the surface of the indium target. Accordingly, when an indium target is bonded with an indium-tin solder material, it is preferable to carry out the bonding at the lowest possible temperature. Inventors of the present invention also have found that the diffusion of tin is affected by temperature or time.

Based on the findings described above, the inventors have carried out intensive studies to solve the aforementioned problems. As a result, it has found that the diffusion of tin into an indium target can be favorably suppressed when an indium target and a backing plate are bonded with an indium-tin solder material and then cooled at a predetermined cooling rate.

Thus, one aspect of the invention that is completed based on the aforementioned findings relates to a laminated structure in which a backing plate, an indium-tin solder material, and an indium target are laminated in this order and concentration of tin in a 2.5 to 3.0 mm thickness range of the indium target from the indium-tin solder material side surface is 5 wtppm or less.

According to one embodiment of the laminated structure of the invention, the concentration of tin in a 2.0 to 2.5 mm thickness range of the indium target from the indium-tin solder material side surface is 100 wtppm or less.

According to another embodiment of the laminated structure of the invention, the concentration of tin in a 2.0 to 2.5 mm thickness range of the indium target from the indium-tin solder material side surface is 80 wtppm or less.

According to another embodiment of the laminated structure of the invention, the concentration of tin in a 1.5 to 2.0 mm thickness range of the indium target from the indium-tin solder material side surface is 200 wtppm or less.

According to still another embodiment of the laminated structure of the invention, the concentration of tin in a 1.5 to 2.0 mm thickness range of the indium target from the indium-tin solder material side surface is 160 wtppm or less.

Another aspect of the invention relates to a method for producing a laminated structure in which a backing plate, an indium-tin solder material, and an indium target are laminated in this order, including bonding an indium target and a backing plate by using an indium-tin solder material at the temperature of 120 to 140° C. and cooling the bonded backing plate, indium-tin solder material, and indium target at cooling rate of 2.5° C./min or more.

According to one embodiment of the method for producing the laminated structure of the invention, for the bonding, the indium target and the backing plate having the temperature which is 8 to 20° C. higher than that of the indium target are bonded by using an indium-tin solder material.

According to another embodiment of the method for producing a laminated structure of the invention, concentration of tin in the indium-tin solder material used for the bonding is 10 to 60 at %.

According to the invention, a laminated structure with good use efficiency in which diffusion of tin from an indium-tin solder material to an indium target is favorably suppressed, and a method for producing the same can be provided.

DETAILED DESCRIPTION OF EMBODIMENTS

The laminated structure of the invention is formed by having a backing plate, an indium-tin solder material, and an indium target laminated in this order. Shape of the backing plate is not specifically limited. It may be formed into a disc shape having predetermined thickness and diameter. Materials for forming the backing plate are not specifically limited, and it may be formed of a metallic material like copper, for example. The indium-tin solder material has a function of bonding an indium target to a backing plate.

In general, when bonded to a backing plate, the indium target receives tin diffusion from an indium-tin solder material. The laminated structure of the invention also contains tin diffusion, but the degree of diffusion is made small according to the production method described below, and thus the tin diffusion to an indium target is controlled to 2.5 mm or less from the indium-tin solder material side surface. Meanwhile, the thickness of tin diffusion is determined based on the concentration of tin at the spot, and if the concentration of tin in the 2.5 to 3.0 mm thickness range from the indium-tin solder material side surface is 5 wtppm or less, the tin diffusion range is estimated as 2.5 mm or less. Concentration of diffused tin is measured by sampling for each target thickness and performing an analysis based on ICP. When the thickness for analysis is thin, diffusion for each thickness can be determined with higher accuracy. However, sampling can be made for every 0.25 mm thickness. For the sampling, lathing or machining can be employed. From the ICP analysis of an indium specimen sampled as above, concentration of tin in the thickness range can be analyzed, and thus the thickness of the tin diffusion can be also obtained accordingly.

With the constitution described above, the laminated structure of the invention has high ratio of sputterable area, and thus has good use efficiency. The concentration of tin in the 2.5 to 3.0 mm thickness range of the indium target from the indium-tin solder material side surface is more preferably 1 wtppm or less. Further, the thickness of tin diffusion in an indium target is more preferably 2.0 mm or less from the indium-tin solder material side surface.

It is also preferable that the concentration of tin in the 2.0 to 2.5 mm thickness range of the indium target from the indium-tin solder material side surface is 100 wtppm or less. According to this constitution, every area of an indium target which is less than 2.0 mm apart from the indium-tin solder material side surface satisfies the purity 4 N, and thus it can be used as a target for CIGS solar cell. Compared to a conventional indium target which has tin concentration of more than 100 wtppm in the 2.5 to 3.0 mm range of an indium target from the solder material side surface, use rate increase as much as 6 to 50% can be achieved from a case in which the corresponding target has thickness of 5 to 20 mm. Concentration of tin in the corresponding range is more preferably 80 wtppm or less.

It is also preferable that the concentration of tin in the 1.5 to 2.0 mm thickness range of the indium target from the indium-tin solder material side surface is 200 wtppm or less. According to this constitution, the purity 4 N standard can be substantially satisfied at the side of formed film. During sputtering, a difference in erosion rate is caused in view of positional relation of a magnet in a target surface. In general, when the deepest erosion part that is most prone to sputtering reaches the corresponding diffusion range, use will be ended. In this case, since sputtering is made with purity of at least 4 N while no other area reaches the diffusion range, when concentration of tin in the 1.5 to 2.0 mm thickness range is 200 wtppm or less, the tin contamination sputtered from the deepest part can be fully diluted, and thus it becomes possible to satisfy the purity 4 N in the film. Concentration of tin in the corresponding region is more preferably 160 wtppm or less.

Thickness of the indium-tin solder material in the laminated structure is preferably 0.05 to 0.5 mm. When the thickness of the indium-tin solder material is lower than 0.05 mm, sufficient adhesion cannot be provided. On the other hand, if the thickness of the indium-tin solder material is higher than 0.5 mm, not only the effects like adhesion are damaged but also an expensive metal needs to be contained in higher amount, and therefore it is disadvantageous in terms of the cost. More preferably, thickness of the indium-tin solder material is 0.1 to 0.4 mm.

Next, preferred example of the method for producing the laminated structure of the invention is explained in order.

First, an indium ingot is prepared by melt casting or the like. Subsequently, the indium ingot is processed to have a pre-determined shape to give an indium target. The raw indium used therefor preferably has high purity to achieve higher conversion efficiency of a solar cell to be produced. For example, indium with purity of 99.99% by mass (4 N) or more is preferably used.

Next, a backing plate with a pre-determined material and shape is prepared. The indium target is heated to 120 to 140° C., and the backing plate is also heated. After reaching a full stationary state, the indium-tin solder material is first melt and applied on the backing plate by sufficient spreading using a scraper or the like. The indium target is also applied with the indium-tin solder material, and the bonding is carried out immediately.

After that, the bonded backing plate, indium-tin solder material, and indium target are cooled at cooling rate of 2.5° C./min or more to prepare a laminated structure.

According to the aforementioned constitution, tin diffusion into an indium target can be suppressed, and the reason is due to the fact that diffusion of a material is affected by temperature and time.

The temperature of an indium target is preferably 125 to 135° C.

The cooling rate is preferably 4° C./min or more. The cooling rate is obtained by dividing the difference between the temperature of an indium target (T° C.) and 40° C., which is believed to be the temperature for full suppression of tin diffusion into a solid layer, that is, (T−40[° C.]), by the time (min) required for the cooling.

Further, for the bonding described above, it is preferable that the backing plate to be bonded to an indium target be set to have the temperature which is 8 to 20° C. higher than that of the indium target. Accordingly, irregular solidification of a solder material which often occurs during bonding can be suppressed and, even when such problem itself occurs, it can be immediately re-melt and recovered, and by yielding favorable bonding, the adhesion ratio between the target and backing plate can be increased to 90% or more. It is also preferable that the temperature of the backing plate be heated to the temperature which is 10 to 15° C. higher than that of the indium target. Further, by combining such setting of temperature difference with the bonding method described above, obtaining high adhesion ratio and lowering tin diffusion can be achieved simultaneously.

Concentration of tin in an indium-tin solder material used for bonding is preferably 10 to 60 at %. According to this constitution, the temperature difference between an indium target having low melting temperature and a solder material can be established at practically sufficient level, and thus favorable bonding can be achieved. For increasing the temperature difference, tin concentration is preferably 20 to 55 at %.

The laminated structure obtained as described above can be desirably used as a sputtering target of a light absorption layer for CIGS-type thin film solar cell.

EXAMPLES

Herein below, Examples and Comparative Examples of the invention will be described. However, Examples are provided for better understanding of the present invention and advantages thereof, and it is not intended to limit the invention by them.

Examples 1 to 12 and Comparative Examples 1 to 7

First, indium with purity of 4 N was used as a raw material and the indium material was melt at 160° C. The melt material was poured into a mold having a cylinder shape with diameter of 205 mm and height of 7 mm followed by natural cooling. Thus-obtained indium ingot was processed to a disc having diameter of 204 mm and thickness of 6 mm and used as a sputtering target.

Next, a backing plate made of copper having diameter of 250 mm and thickness of 5 mm was prepared.

Next, in a state in which the backing plate was heated to the temperature A described in Table 1 and the indium target was heated to the temperature B described in Table 1, the indium-tin solder material having the tin concentration described in Table 1 was applied on the backing plate and the indium target in this order immediately followed by bonding of the backing plate to the indium target. Thereafter, by cooling at the cooling rate described in Table 1, a laminated structure was produced.

(Evaluation)

The indium targets of the laminated structures obtained from Examples and Comparative Examples were cut to have different thicknesses by machining in the thickness directions from the indium-tin solder material side surfaces, recovered, and subjected to ICP analysis for measuring tin concentrations.

Further, the adhesion states (that is, adhesion ratios) between the indium targets and the backing plates of the laminated structures obtained from Examples and Comparative Examples were determined by using an electronic scanning type ultrasonic diagnostic apparatus. Specifically, the targets were set in a water bath of the diagnostic apparatus, and the measurements were made with frequency number range of from 1.5 to 20 MHz, pulse repeat frequency number of 5 kHz, and scan speed of 60 mm/min. From the image obtained, the ratio of the adhered area compared to the total area was calculated and represented as the adhesion ratio.

Conditions for each measurement and measurement results are illustrated in Table 1.

TABLE 1

|  | Backing plate temperature A (° C.) | Indium target temperature B (° C.) | Cooling rate (° C./min) | Tin concentration in indium-tin solder material (at %) | Tin concentration of 2.5 to 3.0 mm [wtppm] | Tin concentration of 2.0 to 2.5 mm [wtppm] | Tin concentration of 1.5 to 2.0 mm [wtppm] | Adhesion ratio [%] |
|---|---|---|---|---|---|---|---|---|
| Example 1 | 133.5 | 125 | 2.83 | 50 | <5 | <5 | <5 | 92 |
| Example 2 | 135 | 125 | 2.83 | 50 | <5 | 6 | 12 | 95 |
| Example 3 | 140 | 125 | 2.83 | 50 | <5 | 9 | 40 | 99 |
| Example 4 | 145 | 125 | 2.83 | 50 | <5 | 11 | 51 | 99 |
| Example 5 | 140 | 125 | 8.50 | 50 | <5 | 7 | 12 | 99 |
| Example 6 | 140 | 125 | 5.67 | 50 | <5 | <5 | 11 | 99 |
| Example 7 | 140 | 125 | 4.25 | 50 | <5 | <5 | 9 | 99 |
| Example 8 | 140 | 130 | 2.81 | 40 | <5 | <5 | 15 | 99 |
| Example 9 | 145 | 135 | 2.79 | 30 | <5 | 6 | 12 | 99 |
| Example 10 | 150 | 140 | 2.86 | 20 | <5 | 6 | 11 | 99 |
| Example 11 | 135 | 135 | 2.83 | 50 | <5 | <5 | <5 | 91 |
| Example 12 | 125 | 125 | 2.83 | 50 | <5 | <5 | <5 | 90 |
| Comparative Example 1 | 140 | 130 | 2.00 | 50 | 8 | 108 | 202 | 99 |
| Comparative Example 2 | 140 | 130 | 1.70 | 50 | 16 | 110 | 210 | 99 |
| Comparative Example 3 | 140 | 130 | 1.50 | 50 | 18 | 125 | 221 | 99 |
| Comparative Example 4 | 140 | 130 | 1.25 | 50 | 25 | 131 | 290 | 99 |
| Comparative Example 5 | 140 | 130 | 1.00 | 50 | 45 | 140 | 301 | 99 |
| Comparative Example 6 | 150 | 145 | 2.83 | 50 | 69 | 180 | 315 | 99 |
| Comparative Example 7 | 155 | 150 | 2.83 | 50 | 71 | 185 | 320 | 99 |

According to Table 1, in Examples 1 to 12, all the diffusions of tins from the indium-tin solder materials to the indium targets were suppressed favorably and all the favorable adhesion ratios between the indium targets and the backing plates were obtained. Meanwhile, in the Examples 11 and 12, since the backing plate temperatures were not 8 to 20° C. higher than that of the indium target during the bonding, the adhesion ratios were slightly lowered compared to other Examples.

According to Comparative Examples 1 to 5, since the rates of cooling all the bonded backing plates, indium-tin solder materials, and indium targets were slower than 2.5° C./min, diffusions of tins from the indium-tin solder materials to the indium targets were significant.

According to Comparative Examples 6 and 7, since the temperatures of the indium targets were not within the range of 120 to 140° C. during the bonding, diffusions of tins from the indium-tin solder materials to the indium targets were also significant.

What is claimed is:
1. A laminated structure comprising:
a backing plate;
an indium-tin solder material, wherein a thickness of the indium-tin solder material is between 0.1 mm and 0.5 mm; and
an indium target,
the structure laminated in this order, wherein a concentration of tin in a 2.5 to 3.0 mm thickness range within the indium target, as measured from a indium-tin solder material side surface, is 5 wtppm or less.

2. The laminated structure according to claim 1, wherein the concentration of tin in the 2.0 to 2.5 mm thickness range within the indium target as measured from the indium-tin solder material side surface is 100 wtppm or less.

3. The laminated structure according to claim 2, wherein the concentration of tin in the 2.0 to 2.5 mm thickness range within the indium target as measured from the indium-tin solder material side surface is 80 wtppm or less.

4. The laminated structure according to any one of claims 1 to 3, wherein the concentration of tin in a 1.5 to 2.0 mm thickness range within the indium target as measured from the indium-tin solder material side surface is 200 wtppm or less.

5. The laminated structure according to claim 4, wherein the concentration of tin in the 1.5 to 2.0 mm thickness range within the indium target as measured from the indium-tin solder material side surface is 160 wtppm or less.

* * * * *